(12) United States Patent
Budinger et al.

(10) Patent No.: US 6,574,110 B1
(45) Date of Patent: Jun. 3, 2003

(54) STACKABLE SLIDE MOUNT SYSTEM FOR MODEM DEVICES

(75) Inventors: Dan Budinger, Arlington Heights, IL (US); Irene Gilbert, Palatine, IL (US); John G. Fijolek, Naperville, IL (US)

(73) Assignee: 3Com Corporation, Santa Clara, CA (US)

(*) Notice: Subject to any disclaimer, the term of this patent is extended or adjusted under 35 U.S.C. 154(b) by 0 days.

(21) Appl. No.: 09/584,928

(22) Filed: May 31, 2000

Related U.S. Application Data

(60) Provisional application No. 60/170,407, filed on Dec. 13, 1999.

(51) Int. Cl.⁷ .............................................. H05K 7/00
(52) U.S. Cl. .................. 361/729; 361/790; 361/801; 361/727; 439/74; 439/260; 439/257
(58) Field of Search .............................. 361/729, 748, 361/790, 801, 715, 727, 735, 752, 741, 725, 683, 682, 810, 788; 439/74, 257, 260, 262, 283, 290, 324

(56) References Cited

U.S. PATENT DOCUMENTS

| | | | | |
|---|---|---|---|---|
| 4,939,622 A | * | 7/1990 | Weiss et al. ................ | 361/338 |
| 4,941,841 A | * | 7/1990 | Darden et al. .............. | 439/377 |
| 5,067,040 A | * | 11/1991 | Fallik ........................ | 361/384 |
| 5,194,013 A | * | 3/1993 | Propp ......................... | 439/265 |
| 5,515,239 A | * | 5/1996 | Kamerman et al. ......... | 206/509 |
| 5,602,721 A | * | 2/1997 | Slade et al. ................. | 206/504 |
| 5,676,553 A | * | 10/1997 | Leung ......................... | 439/74 |
| 6,098,131 A | * | 8/2000 | Unger et al. ................ | 710/101 |
| 6,215,656 B1 | * | 4/2001 | O'Neal et al. .............. | 361/686 |
| D447,483 S | * | 9/2001 | Wu .............................. | D14/313 |

* cited by examiner

*Primary Examiner*—David Martin
*Assistant Examiner*—Hung Bui
(74) *Attorney, Agent, or Firm*—McDonnell Boehnen Hulbert & Berghoff

(57) ABSTRACT

The present invention relates to an improved mounting for stacking modem devices. Each mounting includes stacking feet and stacking slots that permit the mountings to be securely stacked on top of one another. Each mounting is configured to receive a modem device. Each mounting also includes connectors configured to interconnect with corresponding connectors of the modem device. For instance, each mounting and the modem have interconnecting power connections, RJ-45 connections, cable connections, and serial data connections. The modem devices can be slid into place for testing, initialization or installation without disassembling the stack. The present invention also provides configuring the mountings so the multiple modem devices can be connected back to back and communicating without a hybrid fiber/coax network connection.

10 Claims, 1 Drawing Sheet

STACKABLE SLIDE MOUNT SYSTEM FOR MODEM DEVICES

This application claims the benefit of Provisional application No. 60/170,407, filed Dec. 13, 1999.

FIELD OF THE INVENTION

The present invention relates to modem devices. More specifically, it relates stackable mounting of such modem devices.

BACKGROUND OF THE INVENTION

During mass testing or initialization of modem devices, such as cable modem devices, the task of the technician involves the constant changing of the wiring for each modem. This is a slow and costly process that results in stress to the connecting components on the modem.

To speed the testing or initialization processes, modem devices have been provided with stacking clips that allow numerous modems to be assembled together for testing by stacking multiple modems one on top of the other. Likewise, when a large number of modems are being utilized at a centralized location, they are frequently stacked in order to efficiently utilize space. However, when a modem toward the middle of the stack fails, the entire stack of modems must often be disassembled in order to remove the defective modem.

SUMMARY OF THE INVENTION

The present invention relates to a stackable slide mount for each modem device. Each slide mount includes stacking clips that permit the mounts to be securely stacked on top of one another. For example, each mount may have stackable interlocking feet and slots, where the feet are designed to fit within the slots of an adjacent mount. Each mount is configured to receive a slide mounting modem device. Each mount includes connectors configured to interconnect with corresponding connectors on each slide mounting modem device. For instance, each mount and modem may have interconnecting power connections, RJ-45 connections, and serial data connections.

A slide mount will, for example, have a female connector for the serial data connection along a back wall of mount while the slide mounting modem device will have a male connector for the serial data connection located at a portion of a back face of the modem housing that corresponds to the location of the female connector on the back wall of the mount. Thus, when the slide mounting modem device is slid into the slide mount, the male and female connectors for the serial data connection will come into contact and interconnect to form the serial data connection.

Using the present invention, the slide mounts can be stacked and permanently wired. Slide mountable modem devices can then be slid into place for testing, initialization or installation without disassembling the stack. When a defective modem device is discovered, it can be quickly and easily removed and replaced with another modem device.

The present invention can be applied to a variety of systems including a cable modem device and mount conforming to the Data Over Cable Service Interface Specifications (DOCSIS). Furthermore, the present system provides for the development of software and hardware to diagnose and initialize any modem via the slide mount system, such as a slide mount and slide mounting modem operating off of a home coaxial cable connection. The present system also provides for a slide mounting cable modem to emulate a DOCsis Cable Modem Termination System (CMTS) with a script bypass of a back-office. The present system also provides for configuring the slide mounts so that multiple modem devices can be connected back to back and communicating without a Hybrid Fiber/Coax network connection.

DETAILED DESCRIPTION OF THE PREFERRED EMBODIMENTS

The present invention relates to a stackable mounting for slide modem devices, using a slide mount to securely stack one device on top of another. Modem devices may be constructed as boxes that are stacked on top of one another in the field. For example, cable modems may be installed in large numbers on a relatively small enclosure. The ability to stack and slide modems in and out of their slots simplifies the work to install, test and maintain the modems in the field. As such, modems that may be mounted using the embodiments of the present invention may be referred to below as "slide modem devices." Embodiments of the present invention advantageously use a slide mount to stack one device on top of another.

Figure 1A:
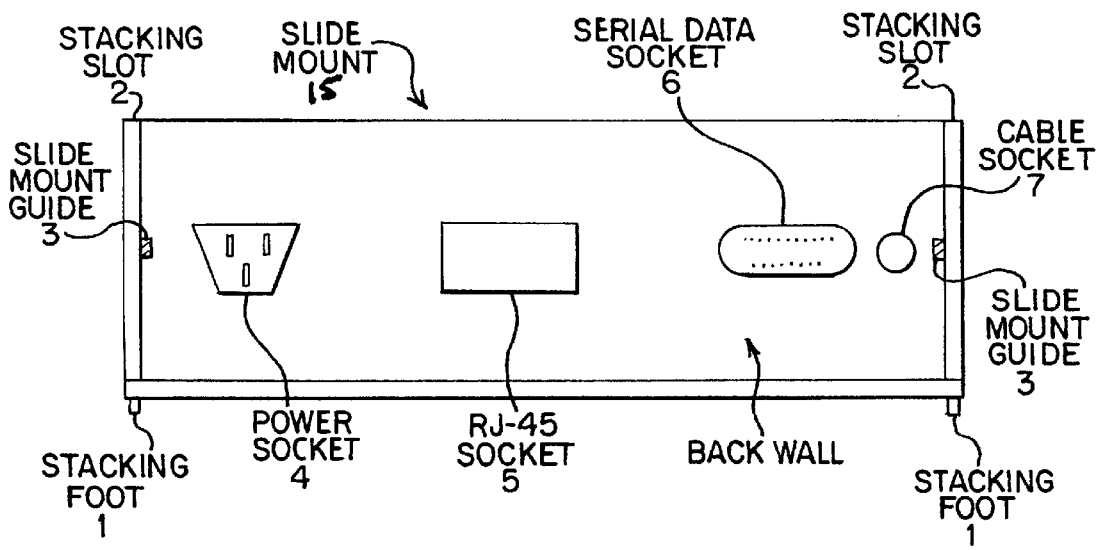
FIG. 1A is a front view of a back panel of a stackable mounting.
Figure 1B:
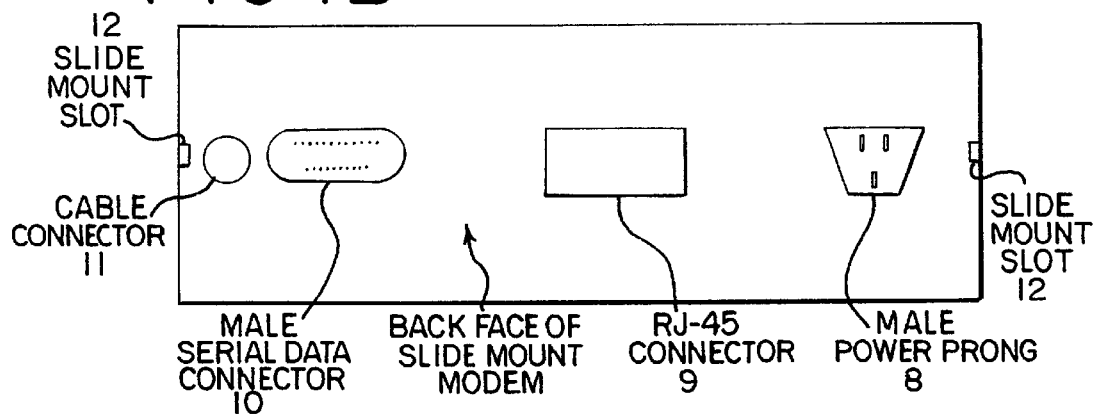
FIG. 1B is a front view of a back of a sliding modem device.
Figure 2:
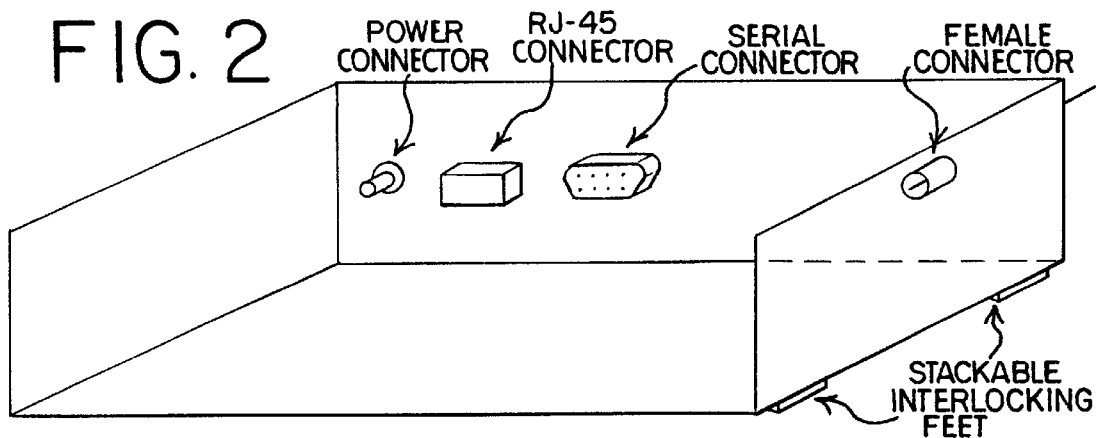
FIG. 2 is a three dimensional plan view of the back panel of the stackable mounting.

In FIGS. 1 to 2, the mounting consists of a bottom, two side panels, and a back. The bottom of the mounting conforms to a substantially rectangular bottom of the modem device. The modem device 20 has a variety of connectors in the back including a male serial data connector 10, an RJ-45 connector 9, a male power prong 8, and a cable connector 11. The modem device 20 also has slide mount slots 12 to easily slide into the mounting 15.

The mounting 15 has two side panels, a bottom, and a back panel. The side panels have slide mount guides 3 to gently slide in the modem device 20 with the slide mount slots 12 fitting into the slide mount guides 3. Each mounting 15 allows a stackable interlocking mechanism of a clip including stacking feet 1 and stacking slots 2. The stacking feet 1 of the mounting 15 fits into the stacking slots 2 of the mounting 15 thereby forming a secure interlocking clip to hold one mounting 15 on top of another mounting 15. The mounting 15 also includes another mechanism for securely placing the modem device 20 into the mounting 15 by sliding in the modem device 20 using the slide mount guides 3 into the slide mount slots 12. This mechanism of sliding the slide mount guide 3 into the slide mount slot 12 allows securely placing the modem device 20 into the mounting 1 and holding the modem device 20 in place.

The mounting 15 includes a power socket 4 to fit with a male power prong 8 of the modem device 20. The power socket 4 connection to the male power prong 8 is necessary for power supply into a wall socket for the modem device 20 to run. The mounting 15 also includes an RJ-45 socket 5 to fit into an RJ-45 connector 9 of the modem device 20 for Ethernet network communications to a personal computer.

The mounting 15 also includes a serial data socket 6 for serial connection to a telephone, if necessary. The modem device 20 has a male serial data connector 10 for the serial data connection located at the back of the modem device 20. When the modem device 20 slides into the mounting 15, the serial data connector and the male serial data connector 10 come into contact to form the serial data connection. The mounting 15 includes a cable socket 7 to fit with a cable connector 11 of the modem device 20 to establish a cable connection.

The mounting 15 can be stacked and permanently wired. The interlocking mechanism of clipping and sliding allow testing, initialization and installation without the need to disassemble the stack. Whenever the modem device 15 is defective, the modem device 15 can easily be removed and replaced with another modem device.

The present invention can be applied to a variety of systems including but not limited to a cable modem device as well as a cable modem termination system. The present system provides a means to stack multiple modem devices back to back without a hybrid/coaxial network connection.

The present invention is readily accessible when testing and configuring multiple modem devices at once. Instead of changing the wiring for each modem device, the present invention allows easy disassembly of the modem devices during and after mass testing or initialization. The present method allows speeding the testing and initialization process of the modem devices. The stacking also allows utilizing space efficiently.

In view of the wide variety of embodiments to which the principles of the invention can be applied, it should be understood that the illustrated embodiments are exemplary only, and should not be taken as limiting the scope of the present invention. In addition, the present invention can be implemented for initialization and testing any type of network devices.

The claims should not be read as limited to the described order or elements unless stated to that effect. Therefore, all embodiments that come within the scope and spirit of the following claims and equivalents thereto are claimed as my invention.

What is claimed is:

1. An improved mounting for stacking modem devices, the modem devices having a back panel, a rectangular bottom, two opposite side panels connected to the two sides of the rectangular bottom, a first connector on the back panel and two slide mount slots along the sides, the improved mounting comprising:

(g) a bottom conforming to said rectangular bottom of said modem device;

(h) two side panels opposite each other along bottom of said mounting;

(i) stacking feet extending from said bottom of said mounting;

(j) stacking slots along top of said side panels to receive stacking feet connected to a second mounting stacked on top of the mounting;

(k) a slide mount guide on said two side panels to fit said slide mount guide of said modem device; and (l) a back connected to said bottom and said two side panels, the back having a second connector corresponding to said first connector, said second connector positioned to fit into the first connector to attach said modem device.

2. The mounting according to claim 1, wherein said stacking feet fit into said stacking slots for securely stack said modem devices.

3. The mounting according to claim 1, wherein said second connector of said mounting comprises a power socket.

4. The mounting according to claim 3, wherein said power socket fits with a male power prong of said first connector from said modem device for interconnecting to a power supply.

5. The mounting according to claim 1, wherein said second connector comprises an RJ-45 socket.

6. The mounting according to claim 5, wherein said RJ 45 socket fits with an RJ-45 connector of said first connector from said modem device for interconnecting to a computer.

7. The mounting according to claim 1, wherein said second connector comprises a serial data socket.

8. The mounting according to claim 7, wherein said serial data socket fits with a male serial data connector of said first connector from said modem device for interconnecting to a serial port.

9. The mounting according to claim 1, wherein said second connector comprises a cable socket.

10. The mounting according to claim 9, wherein said cable socket fits with a cable connector of said modem device for a cable connector of said first connector from said modem device for a cable connection.

* * * * *